United States Patent [19]

Rha et al.

[11] Patent Number: 5,728,604
[45] Date of Patent: Mar. 17, 1998

[54] METHOD FOR MAKING THIN FILM TRANSISTORS

[75] Inventors: Sa Kyun Rha, Seoul; Jae-sung Roh, Kyunggi-do, both of Rep. of Korea

[73] Assignee: Goldstar Electron Co., Ltd., Cheongju, Rep. of Korea

[21] Appl. No.: 710,136

[22] Filed: Sep. 13, 1996

Related U.S. Application Data

[63] Continuation of Ser. No. 293,356, Aug. 19, 1994, abandoned.

[30] Foreign Application Priority Data

Aug. 19, 1993 [KR] Rep. of Korea ............ 93-16093

[51] Int. Cl.⁶ .................................................. H01L 21/86
[52] U.S. Cl. .................. 438/41 TFI; 437/40 TFI; 437/21; 437/913
[58] Field of Search .................... 437/41, 21, 40, 437/913, 40 TFI, 41 TFI; 148/DIG. 150

[56] References Cited

U.S. PATENT DOCUMENTS

| | | | |
|---|---|---|---|
| 4,389,481 | 6/1983 | Poleshuk et al. | 437/189 |
| 4,662,064 | 5/1987 | Hsu et al. | 437/195 |
| 5,064,775 | 11/1991 | Chang | 148/DIG. 150 |
| 5,120,666 | 6/1992 | Gotou | 148/DIG. 150 |
| 5,188,973 | 2/1993 | Omura et al. | 437/41 |

FOREIGN PATENT DOCUMENTS

| | | | |
|---|---|---|---|
| 5688356 | 7/1981 | Japan | 437/45 |
| 63269535 | 11/1988 | Japan | 437/241 |
| 3246949 | 11/1991 | Japan | 437/909 |
| 0494133 | 3/1992 | Japan | 437/200 |

OTHER PUBLICATIONS

Wolf, Silicon processing for the VLST Era vol. 2, pp. 194–199; 1986.
16Mbit SRAM Cell Technologies for 2.0V Operation; H. Ohkubo, et al.; 1991 IEEE; pp. 481–484 IDEM.

*Primary Examiner*—Michael Trinh
*Attorney, Agent, or Firm*—Alan R. Loudermilk

[57] ABSTRACT

A method for making semiconductor thin film transistors (TFTs) having a bottom gate such that the gate electrode is formed in a furrow of an insulating layer, with a gate oxide and body polysilicon formed thereon, thereby allowing the source and drain level to be in a smooth plane parallel with the gate level. Steps that may be included in the disclosed method for fabricating thin film transistors having a bottom gate are: a) forming an insulating layer on a substrate, and forming a furrow by etching the insulating layer at a portion corresponding to where a gate line is to be formed; b) forming a gate line in the furrow by depositing a conductive layer, and etching back the conductive layer; c) forming a gate insulator on the gate line, forming a semiconductor layer on the gate insulator; and d) forming impurity regions at opposite sides of the gate line.

7 Claims, 3 Drawing Sheets

METHOD FOR MAKING THIN FILM TRANSISTORS

This application is a continuation of application Ser. No. 08/293,356 filed on Aug. 19, 1994, now abandoned.

BACKGROUND OF THE INVENTION

The present invention relates to methods for making thin film transistors (TFTs), and more particularly to methods for making TFTs of a type having a bottom gate.

Generally, TFTs are widely used in static random access memories (SRAMs) or liquid crystal displays (LCDs) as a load device instead of a load resistor.

Modern technology produces mega-bit-sized static random access memories with reduced cell size and low supply voltage (Vcc), and thus such SRAMs use polysilicon TFTs as loads instead of polysilicon resistors in order to obtain high charging current and low leakage current for the SRAM cell. Therefore it is desirable for the TFT to have high on current and low off current. However, the ratio of on/off current of polysilicon TFTS typically is not high enough to satisfy cell operation stability, which is lowered due to the cell size reduction and lowering of the power supply voltage. If cell size is decreasing, then off current is increasing due to short channel effects, but on current is not increasing, and thus the ratio of on/off current is lowered.

An attempt that has been made to solve this problem for megabit SRAMS is disclosed in the paper "16 Mbit SRAM Cell Technologies for 2.0 V Operation" by H. Ohkubo et al., Technical Digest IEDM 1991, pages 481 to 483. In this paper, the key features of the disclosed technologies include: 1) a symmetrical cell configuration; 2) an access transistor with an N- offset resistor; 3) a ground plate expanded on the cell area; and 4) a polysilicon TFT with an LDO (Lightly Doped Offset) structure, all of which utilize a Self Aligned Contact (SAC) process. The symmetrical cell configuration, the ground plate and the TFT with the LDO structure contribute to cell operation stability.

A conventional process for fabricating a polysilicon TFT of a bottom gate type with an LDO structure is depicted in FIG. 1.

As shown in FIG. 1A, insulating layer 12 is deposited on surface 11 where a TFT is to be formed, and a polysilicon layer is deposited on insulating layer 12. The polysilicon layer is etched to form gate electrode (gate line) 13 by a photo-lithographic process. After this step, gate insulating layer (gate insulator) 14 is formed on gate electrode 13 and insulating layer 12 by a high temperature oxide deposition process. Body polysilicon 15 (or amorphous silicon) is deposited on gate insulator 14 and silicon ions are implanted in order to improve the electrical characteristics. Then, amorphous body silicon layer 15 is annealed for 5 hrs and more at 600°±50° C. After this, as illustrated, implantation process 16 may be carried out for purposes of regulating the threshold voltage.

In the next step, as shown in FIG. 1B, the low concentration impurity region, LDO drain junction 19, is formed at one side of the gate line in body polysilicon 15 by N⁻ impurity ion implantation 18 with photoresist mask 17 serving to limit the drain zone for the Lightly Doped Drain (LDD) structure.

Next, as shown in FIG. 1C, highly doped drain and source regions are formed by implantation of N⁺ impurity ions 110 after patterning photoresist pattern 17' for protecting the LDD junction against the implantation using an offset S/D photoresist mask.

With this type of TFT, since body polysilicon layer 15 is formed on gate 13 and of an angular structural shape, a considerable amount of leakage current still occurs, and due to the gate electrode the step coverage is poor. Therefore, the on/off current ratio is still low and a subsequent metallization process is not easy.

SUMMARY OF THE INVENTION

An object of the present invention is to provide a TFT which has a high on/off current ratio.

Another object of this invention is to provide a TFT with a smoothed planar body polysilicon on a gate electrode, thus improving the characteristics of the TFT.

The objects of the present invention are achieved by a method for making semiconductor TFTs having a bottom gate such that the gate electrode is formed in a furrow of an insulating layer, and the gate oxide and the body polysilicon are deposited thereon, thereby allowing the source and drain level to be in a smoothed plane parallel with the gate level.

According to one aspect of the present invention, a method for fabricating a thin film transistor having a bottom gate comprises the steps of: a) forming an insulating layer on a substrate, and forming a furrow by etching the insulating layer at a portion corresponding to where a gate line is to be formed; b) forming a gate line in the furrow by depositing a conductive layer, and etching back the conductive layer; c) forming a gate insulator on the gate line, forming a semiconductor layer on the gate insulator; and d) forming impurity regions at opposite sides of the gate line.

Before d) step, semiconductor ions are implanted in the semiconductor layer and the semiconductor layer is annealed, and a low concentration impurity region is formed at one side of the gate line.

According to another aspect of the present invention, a method for making a thin film transistor comprises the steps of: a) forming a first insulating layer on a substrate, depositing a conductive layer on the insulating layer, and forming a gate electrode by a photolithographic process; b) depositing a second insulating layer on the gate electrode and the first insulating layer, and etching by a photolithographic process the second insulating layer which exists on the gate electrode and a little wider than the gate electrode's width; c) forming a gate insulating layer and depositing a semiconductor layer on the gate insulating layer; and d) forming impurity regions at opposite sides of the gate electrode in the semiconductor layer.

The semiconductor layer may be formed of polysilicon, and the semiconductor ions may be silicon ions. The first and second insulating layers may be formed of silicon dioxide, the conductive layer may be formed of polysilicon, and the gate insulator may be formed of silicon dioxide. The silicon dioxide layer may be 3000 Angstroms thick or more, and the annealing step may be carried out for about 5 hours or more at 600°±50° C. or by using a laser annealing method. The second silicon dioxide layer may be formed as a high temperature oxide (HTO), a high temperature low pressure deposition oxide (HLD), a low temperature oxide (LTO), an undoped silicate glass (USG), a phosphor-silicate glass (PSG), a boron-phosphor-silicate glass (BPSG), a spin on glass (SOG), or the like.

The method for fabricating a thin film transistor includes the steps of depositing an oxide layer on the silicon substrate, and subsequently over the oxide layer a polysilicon is deposited to form the gate line by carrying out a photoresist process using a gate mask. Then, an oxide layer is deposited for flattening of the gate over the gate line and the oxide layer. The flattening step includes etching the oxide layer with a photoresist pattern mask formed by photoresist, which mask is slightly larger than the gate mask. Consequently, the level of the gate line and the adjacent level of the oxide layer become approximately the same (i.e., approximately planar) and the gate line has the same configuration as that formed in the trench, as described in the aforementioned process. Then, deposition of a body polysilicon is carried out to form the source and drain regions and the drain junction in the body polysilicon at one side of the gate line is formed by carrying out an ion implantation of P⁻ ions for a Lightly Doped Drain (LDD) structure. Finally, highly doped source/drain junctions are formed by a P⁺ion implantation after forming a photoresist pattern mask for protecting the LDD junction against the implantation, using an offset S/D photoresist mask.

According to the flattened gate structure of the present invention provided in the thin film transistor, a higher on/off current ratio is attained to as much as three times greater than that of a conventional bottom gate device.

BRIEF DESCRIPTION OF THE DRAWINGS

The invention will now be described in detail with reference to the attached drawings, in which.

DETAILED DESCRIPTION OF THE PREFERRED EMBODIMENTS

The preferred embodiments of the present invention are explained with reference to FIG. 2.

Process steps for the production of a thin film transistor according to an embodiment of the present invention will now be explained.

Figure 1A:
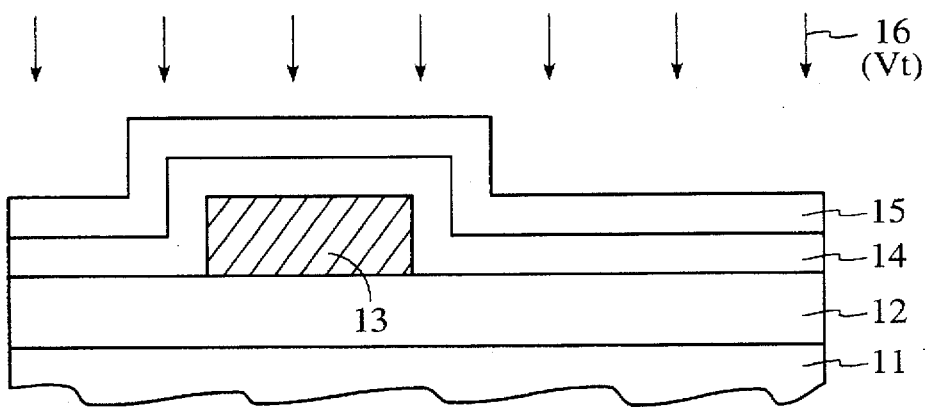
FIGS. 1A, 1B and 1C are sectional views of a portion of a semiconductor substrate and structures thereon for illustrating processes in the production of a conventional thin film transistor.
Figure 1B:
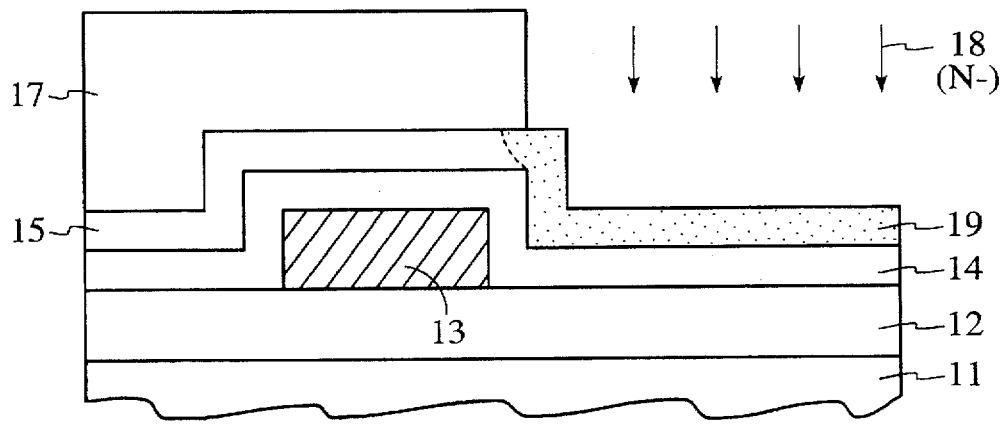
Figure 1C:
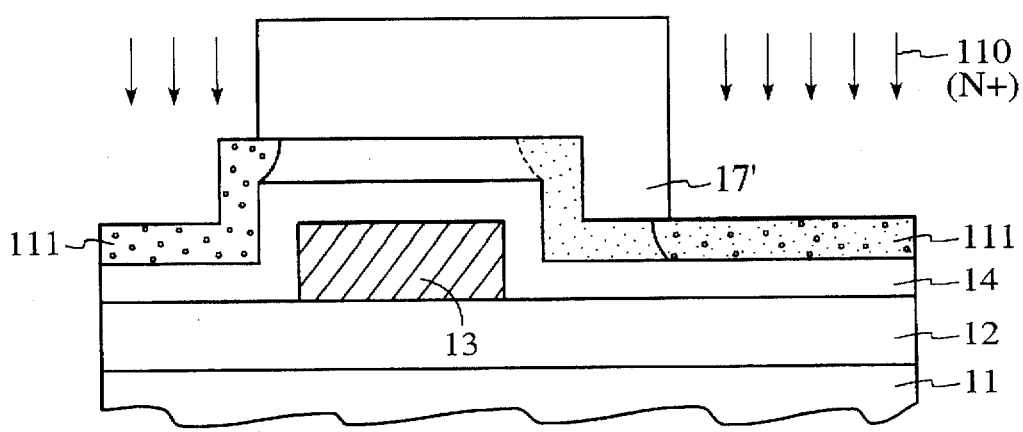
Figure 2A:
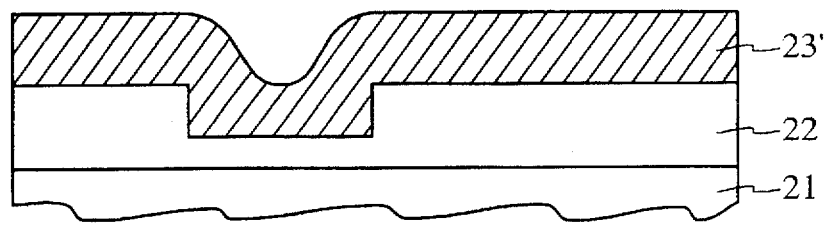
FIGS. 2A, 2B, 2C and 2D are sectional views for illustrating the processes of one embodiment of the present invention.

As shown in FIG. 2A, oxide layer 22 as an insulation layer is formed on substrate 21 of a thickness of 3000 Angstroms or more, and a trench (or furrow) is formed by etching a certain depth of oxide layer 22 using a photoresist mask exposing a portion which corresponds to the location where a gate line is to be formed. For substrate 21, a silicon substrate may be used, where most components of an SRAM circuit, such as flip-flops, already have been formed.

Then, as a conductive layer, first polysilicon layer 23' is deposited over oxide layer 22 including the trench portion, which will be used as the gate electrode.

Figure 2B:
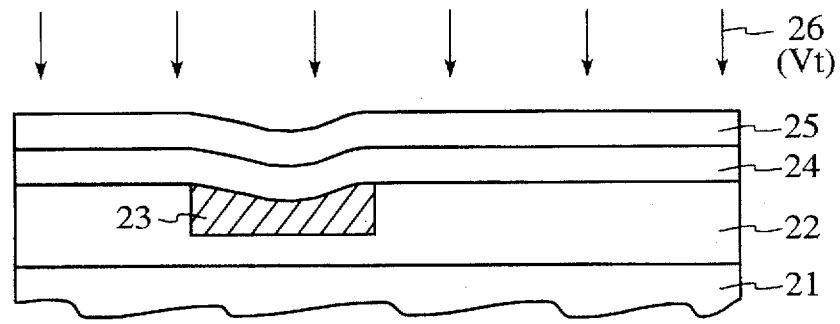
Figure 2C:
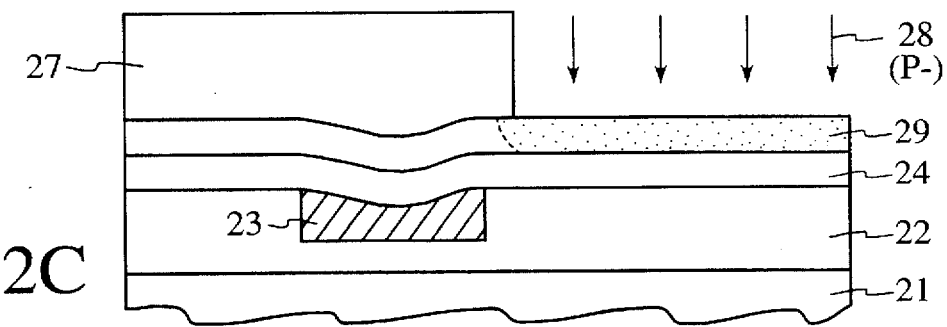

In next step, as shown in FIG. 2B, polysilicon layer 23' is etched back (blanket etched) to form gate line 23 in the furrow. Over oxide layer 22 and gate line 23, gate insulating layer (insulator) 24 is formed by a high temperature oxide deposition. Body polysilicon 25, formed of polysilicon or amorphous silicon, is deposited thereon. A silicon ion implantation is carried out in order to improve the characteristics of body polysilicon 25. Polysilicon layer 25 becomes more amorphous due to the silicon ion implantation and is annealed for about 5 hours or more at 600° ±50° C. or by using a laser annealing method. After this step, implantation process 26 for regulating the threshold voltage is carried out. In the next step, as shown in FIG. 2C, after making photoresist mask 27, LDD (lightly doped drain) junction 29 is formed in body polysilicon 25 at one side of gate line 23 by P⁻ ion implantation 28 using photoresist mask 27 to mask a portion of the surface as illustrated.

Figure 2D:
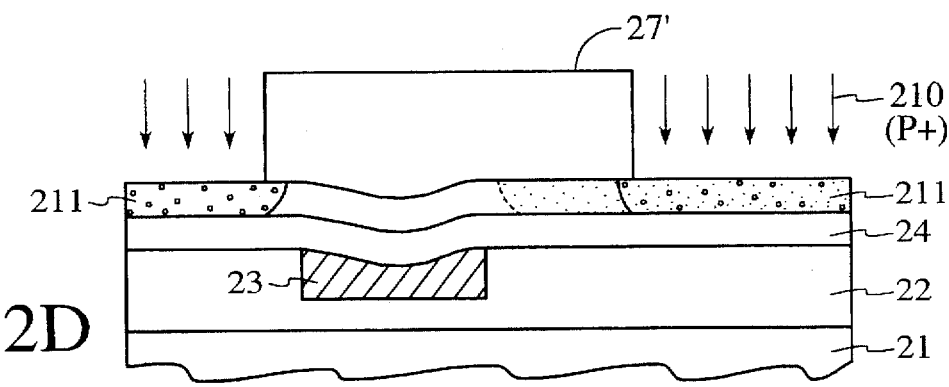

At next step, as shown in FIG. 2D, after making offset photoresist mask 27', which covers a region for the Lightly Doped Drain (LDD), highly doped source/drain junction 211 is formed by P⁺ion implantation 210 with photoresist mask 27' protecting the LDD junction against the implantation. Thereby, a TFT of a bottom gate type is formed.

A second method according to the present invention will now be explained with reference to FIGS. 3A, 3B, 3C and 3D.

Figure 3A:
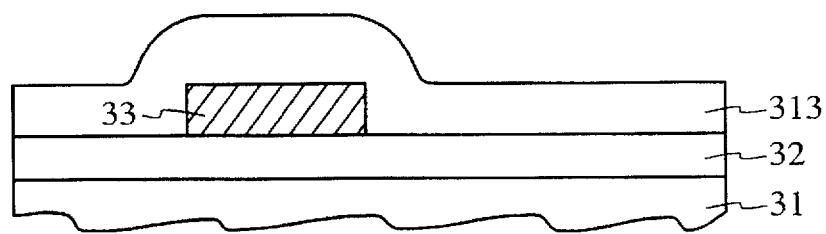
FIGS. 3A, 3B, 3C and 3D are sectional views for illustrating the processes of a further embodiment of the present invention.

As shown in FIG. 3A, oxide layer 32 as a first insulating layer is formed on silicon substrate 31, and subsequently on oxide layer 32 a polysilicon layer is deposited. With this embodiment, silicon substrate 31 is provided, on which most components of an SRAM circuit, such as flip-flops, already have been formed. As a gate electrode, word or gate line 33 is formed by a photolithographic process. Then, oxide layer 313 as a second insulating layer is deposited for flattening the wafer surface over gate line 33 and oxide layer 32. Oxide layer 313 may be formed as a high temperature oxide (HTO), a high temperature low pressure deposition oxide (HLD), a low temperature oxide (LTO), an undoped silicate glass (USG), a phosphor-silicate glass (PSG), a boron-phosphor-silicate glass (BPSG), a spin on glass (SOG), or the like.

Figure 3B:
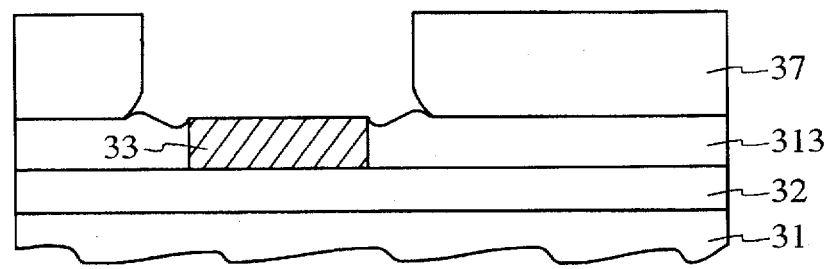

Next, as shown in FIG. 3B, oxide layer 313 over gate line 33 is etched using photoresist mask 37, which is formed by a photoresist step using a photomask which is slightly larger than the gate mask. Consequently, the levels of the gate line and adjacent oxide layer 313 become approximately the same and gate line 33 has approximately the same configuration as that formed in the trench, as described in the aforementioned first embodiment. Also, as illustrated, the surfaces at each side of the gate portion have an uneven shape due to the difference between the size of the photoresist mask used in the flattening step and that of the gate mask.

Figure 3C:
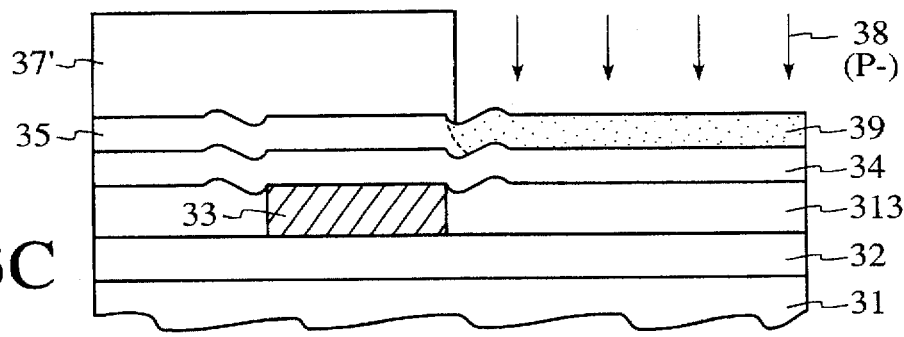

Subsequently, as shown in FIG. 3C, photoresist mask 37 is removed. Over oxide layer 313 and gate line 33, gate insulator 34 is formed by a high temperature oxide deposition process. Then, body polysilicon 35 or amorphous silicon is deposited thereon to form the source and drain regions. A silicon ion implantation is carried out in order to improve the characteristics of body polysilicon 35. A more amorphous body polysilicon layer 35 is obtained by the silicon ion implantation. Body polysilicon layer 35 is annealed for 5 hours or more at 600°±50° C. or by using a laser annealing method. An additional ion implantation step is applied for regulating the threshold voltage.

Next, as shown in FIG. 3C, after making photoresist mask 37', LDD region 39 is formed in body polysilicon 35 at one side of gate line 33 by P⁻ ion implantation 38 using photoresist mask 37' to mask a portion of the surface as illustrated.

Figure 3D:
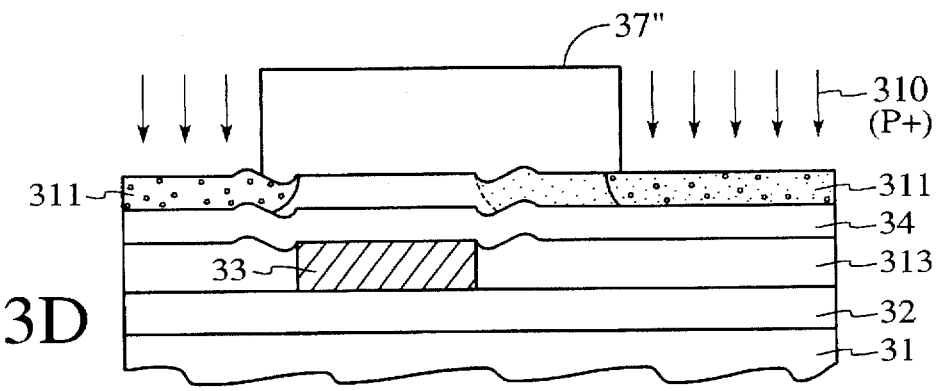

Next, as shown in FIG. 3D, after making offset photoresist mask 37" which covers a region for the Lightly Doped Drain, highly doped source/drain junctions 311 are formed by $P^{3O}$ ion implantation 310 with photoresist mask 37" protecting the LDD junction against the implantation. Thereby, a TFT of the bottom gate type is formed.

As apparent from the foregoing, a flattened gate structure can be provided with a thin film transistor. A higher on/off current ratio may be obtained by the above structure up to as much as three times more than that of a conventional bottom gate TFT.

Further, because the gate line is formed in the trench, the level difference on the semiconductor surface is minimized, and this renders good step coverage, which results in good process margin for a subsequent metallization step.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for making a planar thin film transistor comprising the steps of:

a) forming a first insulating layer on a substrate, depositing a conductive layer on the insulating layer, and patterning the conductive layer to form a gate electrode;

b) depositing a second insulating layer on the gate electrode and the first insulating layer, forming a mask layer on the second insulating layer and patterning the mask layer to form an opening over the gate electrode, wherein the opening has a width wider than the gate electrode, and etching a portion of the second insulating layer over the gate electrode through the opening in the mask layer to expose a top surface of the gate electrode, and removing the mask layer;

c) forming a gate insulator on the second insulating layer and the top surface of the gate electrode, and forming a semiconductor layer on the gate insulator; and d) forming impurity regions at opposite sides of the gate electrode in the semiconductor layer.

2. The method of claim 1, wherein before step d), the method further comprises a step for forming a low concentration impurity region at one side of the gate electrode.

3. The method of claim 1, wherein before step d), the method further comprises the steps of implanting semiconductor ions in the semiconductor layer and annealing the implanted semiconductor layer.

4. The method of claim 3, wherein the semiconductor layer comprises polysilicon, and the semiconductor ions comprise silicon ions.

5. The method of claim 4, wherein the first and second insulating layers comprise silicon dioxide, the conductive layer comprises polysilicon, and the gate insulator comprises silicon dioxide.

6. The method of claim 5, wherein the silicon dioxide layer is about 3000 Angstroms in thickness, and the annealing step is carried out for about 5 hours at 600°±50° C. or by using a laser annealing method.

7. The method of claim 5, wherein the second silicon dioxide layer comprises either a high temperature oxide (HTO), a high temperature low pressure deposition oxide (HLD), a low temperature oxide (LTO), an undoped silicate glass (USG), a phosphor-silicate glass (PSG), a boron-phosphor-silicate glass (BPSG), or a spin on glass (SOG).

* * * * *